(12) United States Patent
Gardner et al.

(10) Patent No.: US 6,211,025 B1
(45) Date of Patent: Apr. 3, 2001

(54) METHOD OF MAKING ELEVATED SOURCE/DRAIN USING POLY UNDERLAYER

(75) Inventors: Mark I. Gardner, Cedar Creek; Mark C. Gilmer, Austin, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/140,009

(22) Filed: Aug. 26, 1998

(51) Int. Cl.⁷ .................................................. H01L 21/335
(52) U.S. Cl. .............................................................. 438/300
(58) Field of Search ............................. 438/300, FOR 177

(56) References Cited

U.S. PATENT DOCUMENTS 5,677,210 * 10/1997 Park et al. .
6,001,716 * 12/1999 Liao .

OTHER PUBLICATIONS

Stanley Wolf and Richard N. Tauber; Silicon Processing for the VLSI Era, vol. 2—*Process Integration*; pp. 436–439; 1990.

Stanley Wolf and Richard N. Tauber; Silicon Processing for the VLSI Era, vol. 3—*The Submicron MOSFET*; pp. 305–308; 1995.

* cited by examiner

*Primary Examiner*—George Fourson
*Assistant Examiner*—Barbara E. Abbott
(74) *Attorney, Agent, or Firm*—Timothy M. Honeycutt

(57) ABSTRACT

A transistor and a method of making the same are provided. The transistor includes a substrate and a gate dielectric layer positioned on the substrate that has first and second sidewall spacers. A gate electrode is positioned on the gate dielectric layer between the first and second sidewall spacers. A semiconductor layer is positioned on the substrate and adjacent the gate dielectric layer. First and second source/drain regions are provided wherein each of the first and second source/drain regions has a first portion positioned in the semiconductor layer and a second portion positioned in the substrate. Processing of the gate dielectric layer and the sidewall spacers is integrated.

10 Claims, 8 Drawing Sheets

US 6,211,025 B1

METHOD OF MAKING ELEVATED SOURCE/DRAIN USING POLY UNDERLAYER

BACKGROUND OF THE INVENTION

1. Field of the Invention

This invention relates generally to semiconductor processing, and more particularly, to an integrated circuit transistor with elevated source/drain regions, and to a method of making the same.

2. Description of the Related Art

A typical field effect transistor implemented in silicon consists of a source and a drain formed in a silicon substrate, and separated laterally to define a channel region in the substrate. A gate electrode composed of a conducting material, such as aluminum or polysilicon, is disposed over the channel region and designed to emit an electric field into the channel region. Changes in the electric field emitted by the gate electrode enable, or alternatively, disable the flow of current between the source and the drain.

In a conventional process flow for forming a typical field effect transistor, a gate oxide layer is grown on a lightly doped silicon substrate and a layer of polysilicon is deposited on the gate oxide layer. The polysilicon and the gate oxide are then anisotropically etched back to the upper surface of the substrate leaving a polysilicon gate electrode stacked on top of a gate oxide layer. Following formation of the polysilicon gate electrode, a source and a drain are formed by implanting a dopant species into the substrate. The gate electrode acts as a hard mask against the implant so that the source and the drain are formed in the substrate self-aligned to the gate electrode. Many conventional semiconductor fabrication processes employ a double implant process to form the source and drain. The first implant is performed self-aligned to the gate electrode to establish lightly doped drain ("LDD") structures. After the LDD implant, dielectric sidewall spacers are formed adjacent to the gate electrode by depositing and anisotropically etching a dielectric material, such as silicon dioxide. The second of the two source/drain implants is then performed self-aligned to the sidewall spacers. The substrate is then annealed to activate the dopant in the source and the drain. Salicidation steps frequently follow the formation of the source and drain.

Early MOS integrated circuits were implemented as p-channel enhancement mode devices using aluminum as the gate electrode material. Aluminum had the advantages of relatively low resistivity and material cost. Furthermore, there was already a large body of manufacturing experience with aluminum in the chip industry developed from bipolar integrated circuit processing.

A later process innovation that is still widely used today, involves the use of heavily doped polysilicon as a gate electrode material in place of aluminum. The switch to polysilicon as a gate electrode material was the result of certain disadvantages associated with aluminum in early fabrication technologies. In conventional semiconductor fabrication processing, aluminum must be deposited following completion of all high temperature process steps (including drive-in of the source and drain regions). As a result, an aluminum gate electrode must ordinarily be separately aligned to the source and drain. This alignment procedure can adversely affect both packing density and parasitic overlap capacitances between the gate and source/drain regions. In contrast, polysilicon with its much higher melting point, can be deposited prior to source and drain formation and therefore provide for self-aligned gate processing. Furthermore, the high temperature capability of polysilicon is routinely exploited to enable interlevel dielectric layers to be applied to provide multiple metallization layers with improved planarity.

Despite the several advantages of polysilicon over aluminum as a gate electrode material, polysilicon has the disadvantage of a much higher resistivity as compared to aluminum. Higher resistivity translates into higher values of interconnect line resistance that can lead to undesirably long RC time constants and DC voltage variations within VLSI or ULSI circuits. The development of polycide films on top of polysilicon layers has alleviated some of the resistivity shortcomings of polysilicon gate electrodes. However, the resistivity of polysilicon gate electrodes in conventional MOS integrated circuit processing still presents a potential impediment to successful process scaling through reductions in the operating voltages of VLSI and ULSI devices.

Another disadvantage of polysilicon as a gate electrode material is polysilicon depletion. In p-channel transistors, the source and drain are commonly formed in the substrate by implanting a p-type dopant, such as boron. The implant also deposits boron into the polysilicon of the gate electrode. Subsequent thermal processing steps to fabricate a conventional p-channel field effect transistor frequently cause boron to diffuse from the gate electrode through the gate oxide layer and into the channel region. If the amount of boron diffused is sufficiently high, the electrical performance of the field effect transistor may be severely degraded due to polysilicon depletion.

Conventional source/drain region processing also presents certain disadvantages. Typically, the source and a drain are formed on opposite sides of the gate electrode by implanting dopant atoms directly into the silicon substrate. The lateral spacing between the source and the drain defines a channel region for the transistor. In conjunction with several other factors, the width of the channel region or "channel length" determines the ultimate speed of the transistor. As a general rule of thumb, smaller channel widths translate into both higher switching speeds and smaller die areas. As advances in process technologies have reduced the minimum feature size to the 0.2 $\mu$m level and below, channel lengths have plummeted. However, realization of the performance benefits associated with short channel lengths requires source/drain regions with rather shallow junctions, that is, junctions positioned near the upper surface of the substrate. Shallow positioning of source/drain junctions can be hard to achieve. The difficulty stems in part from the propensity of some of the dopant atoms in virtually any implant to tunnel or penetrate deeply into the substrate, particularly where there is no intervening structure between the impinging dopant atoms and the upper surface of the substrate. Later heating steps also tend to drive the junctions deeper, particularly for small diameter dopant atoms, such as boron. Off-axis implantation can reduce but not eliminate the potential for tunneling.

Aside from the drawbacks associated with conventional gate electrode and source/drain manufacture, the dielectric sidewall spacer formation aspects of conventional transistor fabrication present certain disadvantages. Although frequently composed of the same material, namely, silicon dioxide, conventional gate dielectric layers and sidewall spacers are commonly formed in completely separate oxidation or chemical vapor deposition steps that require two separate masking and high temperature heating steps. The number of required masking steps is primarily an economic issue tied to the longer through-put time required for the process flow. However, the additional heating step can adversely affect the properties of the source/drain regions. In many conventional process flows, spacer formation follows not only the LDD implant but also the second, and heavier doping source/drain region implant. The heating associated with spacer formation can alone, or in concert with later heating steps, drive the junctions of the source/drain regions to undesirable depths, and/or exacerbate polysilicon depletion in the case of p-channel devices.

The present invention is directed to overcoming or reducing the effects of one or more of the foregoing disadvantages.

SUMMARY OF THE INVENTION

In accordance with one aspect of the present invention, a method of fabricating a transistor on a substrate is provided. The method includes the steps of forming a semiconductor layer on the substrate and a via in the semiconductor layer extending to the substrate. An insulating layer is formed in the via with first and second sidewall spacers. A gate electrode is formed on the insulating layer and first and second source/drain regions are formed, wherein each of the first and second source/drain regions has a first portion positioned in the semiconductor layer and a second portion positioned in the substrate.

In accordance with another aspect of the present invention, a method of fabricating a transistor on a substrate is provided. The method includes the steps of forming a insulating layer on the substrate and forming a via in the insulating layer extending to the substrate. A gate dielectric layer is formed in the via with first and second sidewall spacers. A gate electrode is formed on the gate dielectric layer and first and second source/drain regions are formed by introducing a dopant specie into the substrate through the insulating layer.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
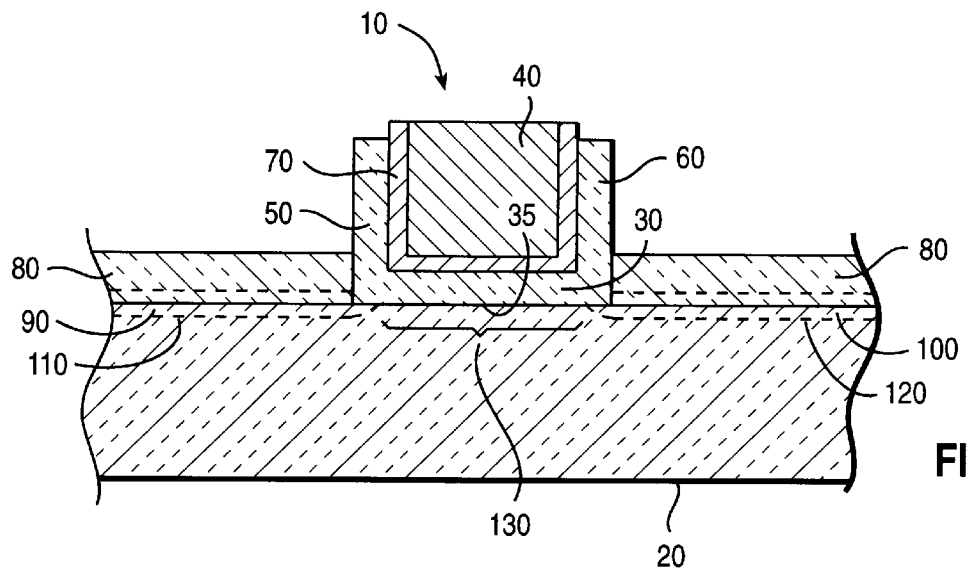
FIG. 1 is a cross-sectional view of an exemplary embodiment of a transistor in accordance with the present invention.

In the drawings described below, reference numerals are generally repeated where identical elements appear in more than one figure. Turning now to the drawings, and in particular to FIG. 1, there is shown a cross-sectional view of an exemplary embodiment of an integrated circuit transistor 10 that is formed on a semiconductor substrate 20. The semiconductor substrate 20 may be composed of n-doped, or p-doped silicon, silicon-on-insulator, or other suitable substrate materials. The transistor 10 includes an insulating or gate dielectric layer 30 that is formed on the upper surface 35 of the substrate 20 and a gate electrode 40 that is formed on the insulating layer 30. The insulating layer 30 is formed with a generally channel or U-shaped cross-section that establishes integrally formed, parallel, laterally spaced vertical sidewalls 50 and 60. The gate electrode 40 is positioned between the opposing spacers 50 and 60. An adhesion layer 70 that has the same general cross-sectional shape as the first insulating layer 30 is positioned between the gate electrode 40 and the insulating layer 30.

A semiconductor layer or underlayer 80 is positioned on the substrate 20, straddling the sidewalls 50 and 60 of the insulating layer 30. Source/drain regions 90 and 100 are positioned partially in the substrate 20 and partially in the underlayer 80 such that the respective junctions 110 and 120 of the source/drain regions 90 and 100 are positioned in the substrate 20 at a very shallow depth. Each of the source/drain regions 90 and 100 is delineated by the dashed lines. The lateral separation of the source/drain regions 90 and 100 defines a channel region 130 in the substrate 20 beneath the gate electrode 40. The phrase "source/drain region(s)" is used herein to describe a region that may serve as either a source or a drain. The skilled artisan will appreciate that a source/drain region may function as a source or a drain depending upon whether it is connected to $V_{SS}$ or $V_{DD}$ during metallization. The underlayer 80 serves as both a vertical extension of the substrate 20 and a partial barrier against the implantation of the source/drain regions 90 and 100. During implantation of the source/drain regions 90 and 100, the underlayer 80 impedes the passage of dopant atoms therethrough, enabling the junctions 110 and 120 to be established very near the upper surface 35 of the substrate 20.

Figure 2:
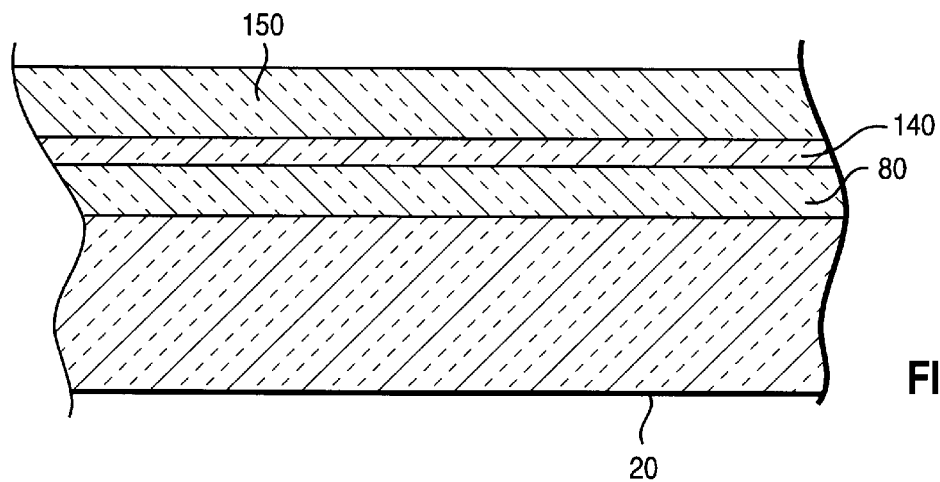
FIG. 2 is a cross-sectional view like FIG. 1 depicting formation of a semiconductor underlayer, an intermediary layer and a top layer in accordance with the present invention.

An exemplary process flow for forming the transistor 10 may be understood by referring now to FIGS. 2, 3, 4, 5, 6, 7 and 8, and initially to FIG. 2. The process will be described in the context of a n-channel device. However, the skilled artisan will appreciate that the transistor 10 may be implemented as n-channel, p-channel or another type of device. The underlayer 80 is formed on the upper surface 35 of the substrate 20. An intermediary layer 140 is formed on the underlayer 80 and a top layer 150 is formed on the intermediary layer 140. As noted above, the underlayer 80 functions as an extension of the substrate 20 and as a medium to control the implants of the source/drain regions 90 and 100 so that the junctions 110 and 120 thereof are positioned near the upper surface 35. In this regard, the underlayer 80 is advantageously composed of a semiconductor material, such as polysilicon, amorphous silicon or like materials. In an exemplary embodiment, the layer 80 is polysilicon with a thickness of about 50 to 200 Å, and advantageously about 130 Å. Well known techniques for applying polysilicon, such as CVD, may be used to deposit the underlayer 80.

The intermediary layer 140 and the top layer 150 are sacrificial structures designed to provide a temporary framework for the formation of the insulating layer 30 (See FIG. 1). through subsequent processing, the top layer 150 and the intermediary layer 140 are etched away, with the intermediary layer 140 providing an etch stop to protect the underlying underlayer 80. In this exemplary embodiment, the intermediary layer 140 is composed of $SiO_2$ and the top layer 150 is composed of polysilicon. The intermediary layer 140 may have a thickness of about 20 to 100 Å and advantageously about 70 Å, and may be formed by thermal oxidation or CVD. If thermal oxidation is selected, the intermediary layer 140 may be grown by exposing the underlayer 80 to an oxygen containing ambient at approximately 800 to 1050° C. for approximately 10 to 60 seconds in a rapid thermal anneal process ("RTA"), or for approximately 5 to 20 minutes in a diffusion tube process. The top layer 150 may have a thickness of about 750 to 2000 Å and advantageously about 1500 AÅ, and may be formed by CVD.

Figure 3:
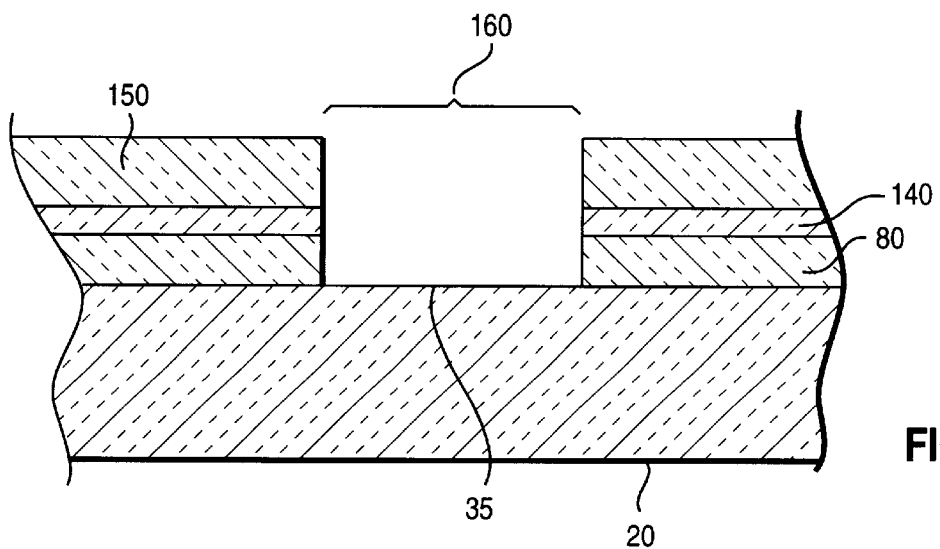
FIG. 3 is a cross-sectional view like FIG. 2 depicting formation of a via to the substrate in accordance with the present invention.

Referring now also to FIG. 3, the top layer 150 is appropriately masked, patterned (i.e. exposed and developed) and the top layer 150, the intermediary layer 140 and the underlayer 80 are anisotropically etched to yield a via 160 extending to the upper surface 35 of the substrate 20. Anisotrophy is desirable from a space-savings standpoint. However, precisely vertical sidewalls for the via 160 are not required. The etch may be by reactive ion etching, chemical plasma etching, or other like anisotropic etching techniques.

Figure 4:
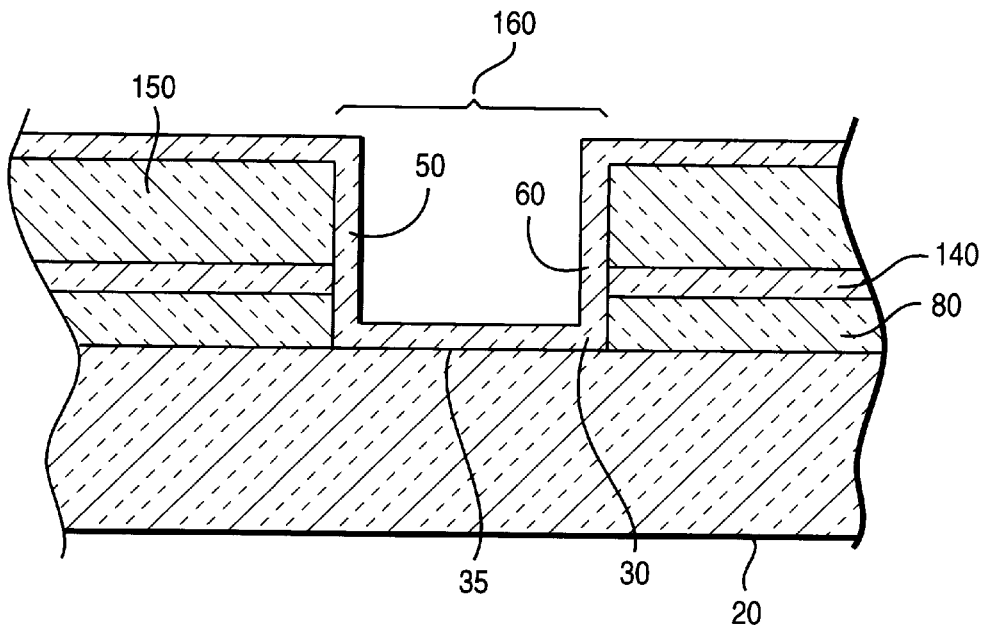
FIG. 4 is a cross-sectional view like FIG. 3 depicting formation of a gate dielectric layer in the via in accordance with the present invention.

Referring now also to FIG. 4, the insulating layer 30 is formed in the via 160. The top layer 150 need not be masked, thus the layer 30 may initially, conformally coat the top layer 150 in addition to the surfaces of the via 160 as shown. The insulating layer 30 may be composed of $SiO_2$, $Ta_2O_5$ or other suitable gate dielectric materials, and is advantageously composed of $SiO_2$. The gate dielectric layer 32 may be 20 to 50 Å thick and is advantageously about 30 Å thick. If $SiO_2$ is selected, the gate dielectric layer 30 may be grown by exposing the surfaces of the underlayer 80 and the substrate 20 exposed by the via 160 to an oxygen containing ambient at approximately 800 to 1050° C. for approximately 10 to 60 seconds in a rapid thermal anneal process ("RTA"), or for approximately 5 to 20 minutes in a diffusion tube process. Depending upon the material and fabrication process selected for the insulating layer 30 (See FIG. 1), the top and intermediary layers 150 and 140 may also provide oxidizable material to facilitate the formation of the insulating layer 30. For example, the intermediary layer 140 may be composed of $SiO_2$, the top layer 150 of polysilicon and the insulating layer 30 of $SiO_2$.

Figure 5:
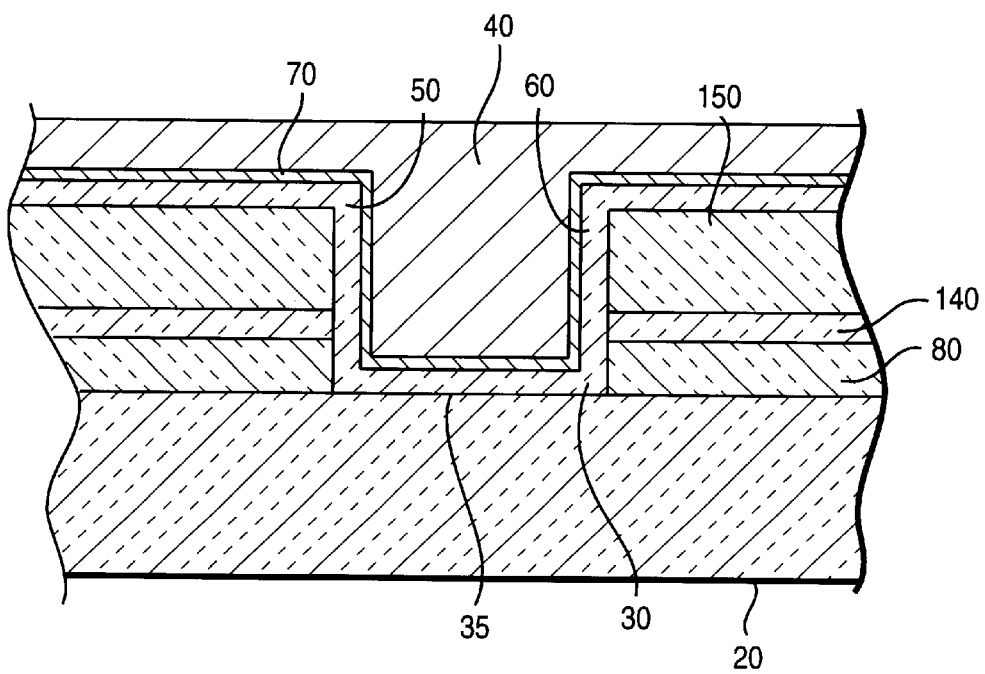
FIG. 5 is a cross-sectional view like FIG. 4 depicting formation of a gate electrode in accordance with the present invention.

Referring now to FIG. 5, the adhesion layer 70 is formed on the insulating layer 30. The adhesion layer 70 is deposited as a conformal layer that coats the vertical sidewalls of the spacers 50 and 60 and the bottom of insulating layer 30. The adhesion layer 70 is designed to facilitate adhesion of the later deposited gate electrode 40. In this regard, the adhesion layer 70 is advantageously composed of titanium nitride. The layer 70 may be deposited by CVD or other suitable TN deposition techniques. Alternatively, the layer 70 may be composed of titanium, a combination of titanium and tungsten, a combination of titanium and TiN, or other suitable adhesion layer materials. The skilled artisan will appreciate that the layer 70 may be unnecessary where the material selected for the gate electrode 40 exhibits good adhesion to the insulating layer 30.

Following formation of the adhesion layer 70, the gate electrode 40 is formed on the insulating layer 30. The gate electrode 40 may be composed of a variety of conducting materials, such as tungsten, tantalum, aluminum, polysilicon, or like materials. In an exemplary embodiment, the gate electrode 40 is composed of tungsten and may be deposited by CVD in a silane reduction process or other suitable tungsten CVD deposition process. A tungsten gate electrode 40 has the advantages of resistance to high temperature degradation and the elimination of polysilicon depletion that is frequently associated with polysilicon gate electrodes in p-channel devices. Accordingly, a tungsten gate electrode 40 enables greater flexibility in the thermal budgeting of the overall process flow.

Figure 6:
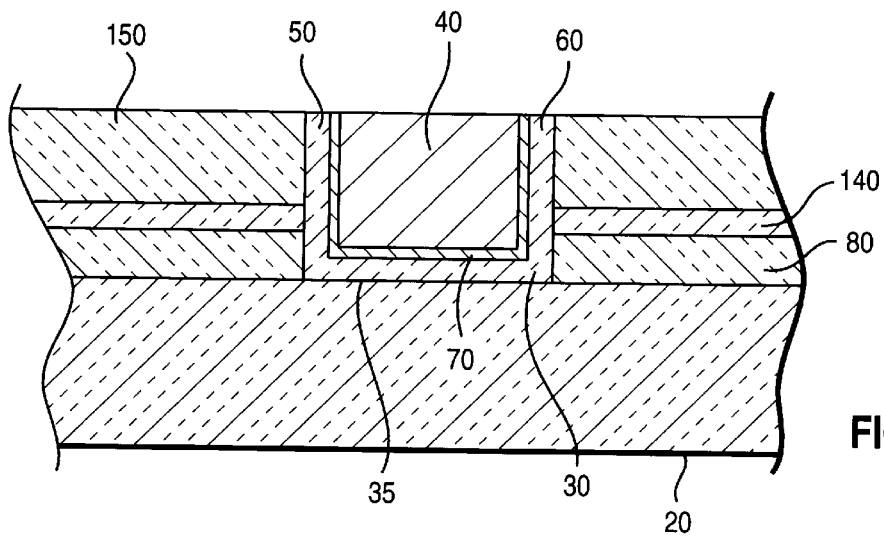
FIG. 6 is a cross-sectional view like FIG. 5 following planarization of the gate electrode in accordance with the present invention.

The CVD formation of the adhesion layer 70 and the gate electrode 40 will conformally coat the top layer 150. Accordingly, and as shown in FIG. 6, the layer 30, the layer 70, and the material used to form the gate electrode 40 are advantageously planarized by chemical mechanical polishing ("CMP"), by etchback planarization, or other suitable planarization techniques to remove the portions of the layer 30, the layer 70, and the material used to form the gate electrode 40 previously projecting above the upper surface of the top layer 150.

Figure 7:
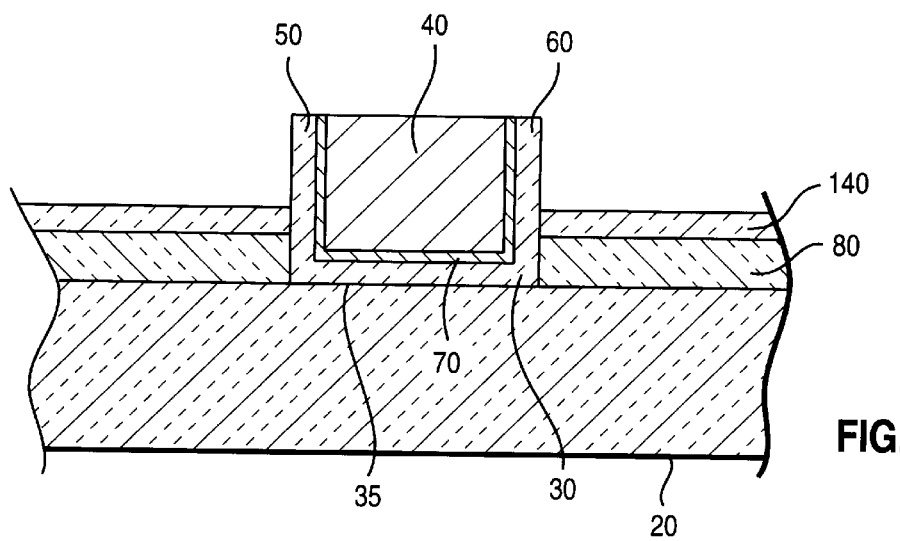
FIG. 7 is a cross-sectional view like FIG. 6 depicting removal of the top layer in accordance with the present invention.

Referring now to FIG. 7, the top layer 150 is removed. This may be accomplished by etching away the top layer 150 to the intermediary layer 140 with the intermediary layer 140 serving as an etch stop. The removal may be by reactive ion etching, chemical plasma etching, or wet etching techniques. Anisotrophy is not necessary. However it is desirable that the etch process does not significantly attack the spacers 50 and 60 of the insulating layer 30. An exemplary wet etch process may consist of a HF dip in a 10 to 1 or 100 to 1 ratio.

Figure 8:
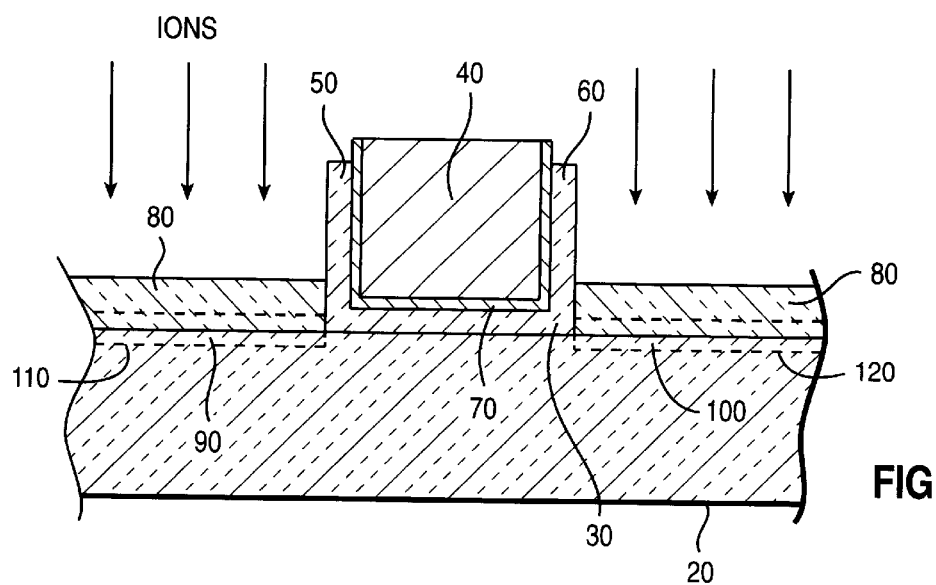
FIG. 8 is a cross-sectional view like FIG. 7 depicting removal of the intermediary layer and formation of source/drain regions in accordance with the present invention.

Referring now also to FIG. 8, the intermediary layer 140 is removed by reactive ion etching, chemical plasma etching, or the like and the source/drain regions 90 and 100 are established by implanting a dopant specie into the underlayer 80 and the substrate 20. The etch will attack the tops of the spacers 50 and 60 as shown, but will remove the intermediary layer 140 selectively to the underlayer 80. The underlayer 80 serves as a barrier against the implant so that the implanted atoms of the dopant specie are slowed significantly. In this way, the source/drain regions 90 and 110 may be established with very shallow junctions 110 and 120. As a result of the semiconducting character of the underlayer 80, each of the source/drain regions 90 and 100 has a portion positioned in the substrate 20 and a portion positioned in the underlayer 80 as shown in FIG. 8. The effective elevating of the source/drain regions 90 and 100 aids in establishment of the very shallow junctions 110 and 120 thereof. The dopant specie as well as the energy and dosage for the implant are all largely a matter of design discretion. In an exemplary embodiment, arsenic may be implanted with a dosage of about 2E15 to 9E15 and advantageously about 6E15 ions/cm$^2$, and with an energy of about 5 to 25 keV and advantageously about 20 keV.

Following the implant, an anneal is performed to activate the source/drain regions 90 and 100 and to yield the completed transistor 10 shown in FIG. 1. The anneal may be accomplished using a RTA process at 800 to 1000° C. for about 10 to 30 seconds or via a diffusion tube process for about 10 minutes at the same temperature range.

Figure 9:
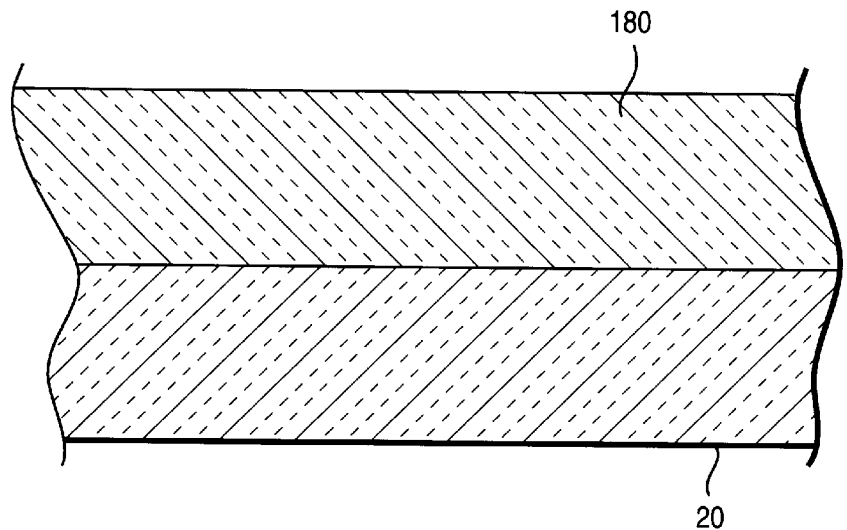
FIG. 9 is a cross-sectional view like FIG. 2 but depicts formation of a semiconductor layer on a substrate in an alternate exemplary process flow in accordance with the present invention.

An alternate exemplary process flow for fabricating a transistor in accordance with the present invention may be understood by referring now to FIGS. 9, 10, 11, 12 and 13 and initially to FIG. 9. In this embodiment, a single semiconductor layer 180 is used in lieu of the underlayer 80, the intermediary layer 140, and the top layer 150 depicted in FIGS. 1–8. As with the aforementioned underlayer 80 depicted in FIGS. 1–8, the semiconductor layer 180 will serve as a vertical extension of the substrate 20. However, the semiconductor layer 180 additionally provides a temporary framework for the later formation of a gate dielectric layer, and is, accordingly, partially sacrificed during subsequent processing. The semiconductor layer 180 may be composed of a variety of semiconductor materials, such as polysilicon, amorphous silicon, or the like. The layer 180 may have a thickness of about 800 to 2500 Å and advantageously about 1700 Å. In an exemplary embodiment, the semiconductor layer 180 is composed of polysilicon that may be deposited using well known CVD techniques.

Figure 10:
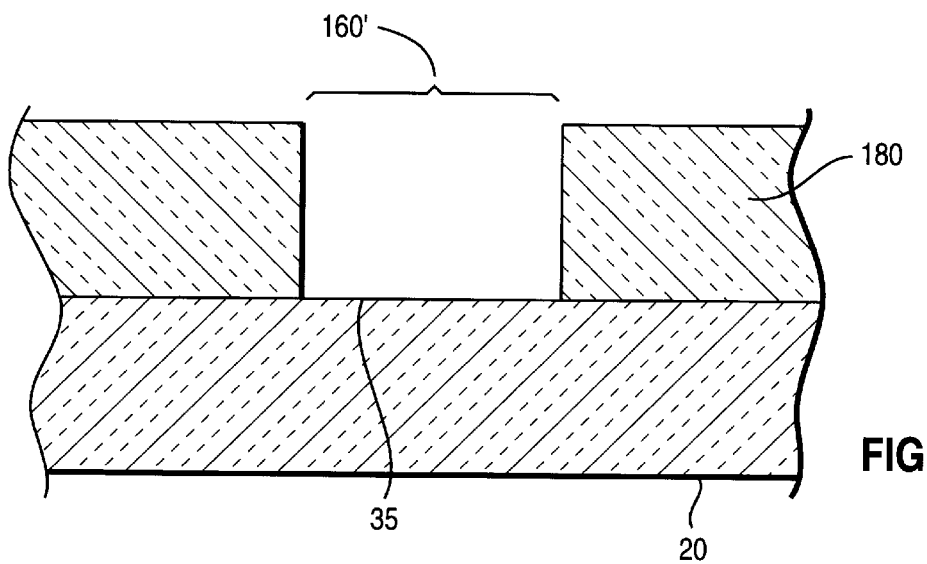
FIG. 10 is a cross-sectional view like FIG. 9 depicting formation of a via to the substrate in accordance with the present invention.

Referring now to FIG. 10, the semiconductor layer 180 is appropriately masked, patterned and anisotropically etched to yield a via 160' extending to the upper surface 35 of the substrate 20. The etch may be accomplished using any of the aforementioned anisotropic etching techniques.

Figure 11:
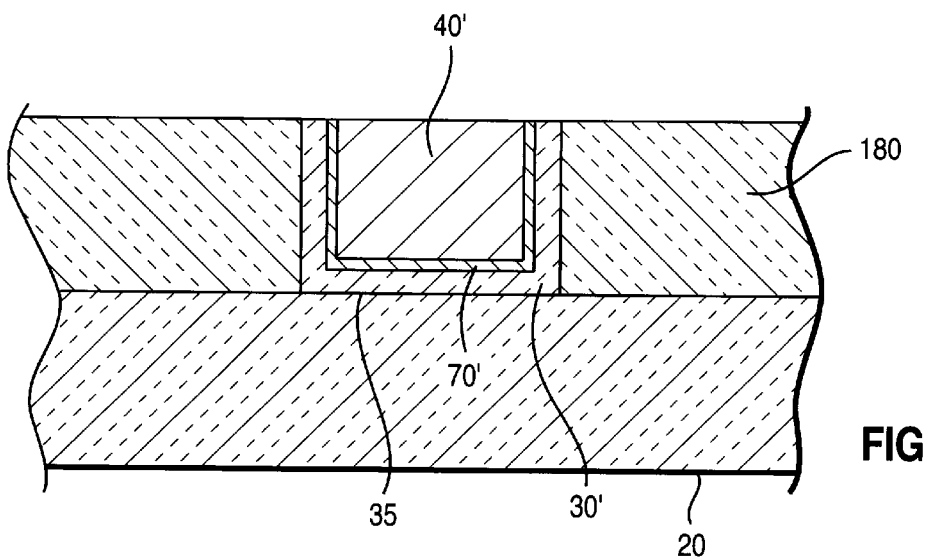
FIG. 11 is a cross-sectional view like FIG. 10 depicting formation of a gate dielectric layer and gate electrode in the via in accordance with the present invention.
Figure 12:
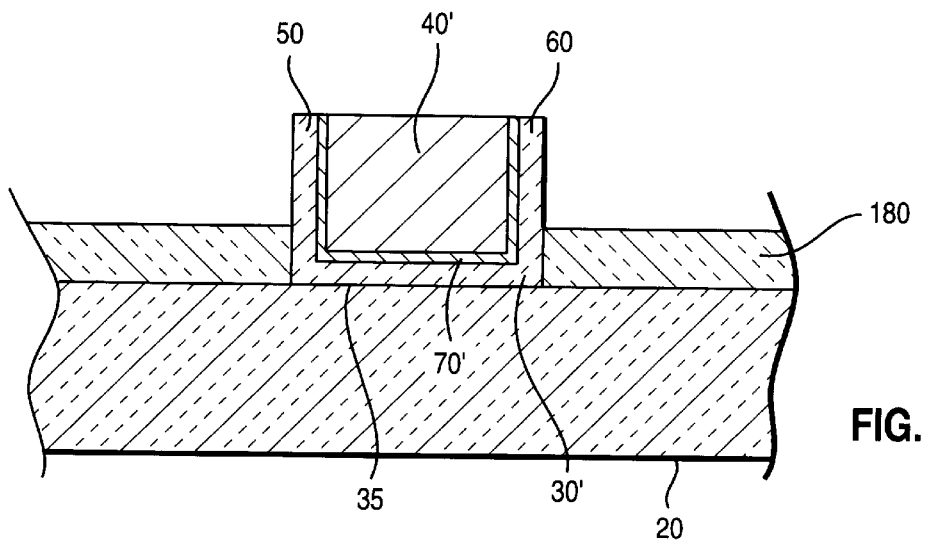
FIG. 12 is a cross-sectional view like FIG. 11 depicting removal of a portion of the semiconductor layer in accordance with the present invention.

Referring now to FIG. 11, the insulating layer, the adhesion layer, and the gate electrode, now designated, respectively, 30', 70' and 40' are formed in the via 160' as generally described above and depicted in FIGS. 2–6. At this stage, an implant may be performed to establish source/drain regions positioned partially in the semiconductor layer 180 and partially in the substrate 20 provided that the energy of the implant is tailored to enable the implanting atoms to penetrate the semiconductor layer 180. However, the energy of the implant may be lowered, and thus the potential for damage to the crystal structures of the substrate 20 and the layer 180 may be reduced by reducing the thickness of the semiconductor layer 180. In this regard, and as shown in FIG. 12, the thickness of the semiconductor layer 180 may be reduced by etching a portion thereof away. The etch may be accomplished via reactive ion etching, chemical plasma etching, a wet etch process or the like. It is desirable that the etch selected does not significantly attack the spacers 50 and 60. The final thickness of the semiconductor layer 180 will be about 50 to 200 Å and is advantageously about 130 Å. End point detection for the etch is deduced from the etch rate.

Figure 13:
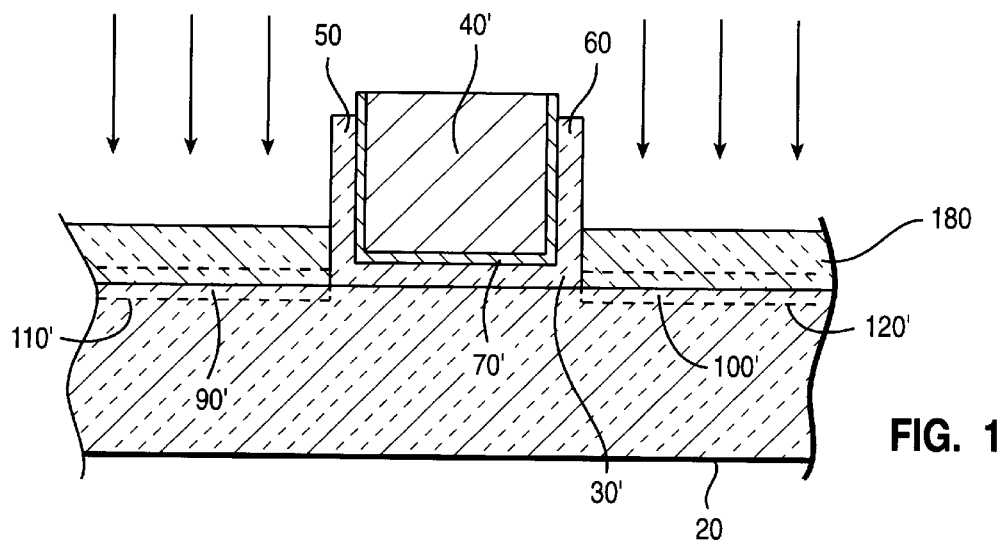
FIG. 13 is a cross-sectional view like FIG. 12 depicting formation of source/drain regions in accordance with the present invention.

Referring now to FIG. 13, the source/drain regions, now designated 90' and 100', are established partially in the semiconductor layer 180 and partially in the substrate 20 by ion implantation through the semiconductor layer 180. The semiconductor layer 180 slows the implanting dopant atoms, enabling the source/drain regions 90' and 100' to be established in the substrate 20 with very shallow junctions 110' and 120'. The ion implantation and anneal regimens described above may be used.

Figure 14:
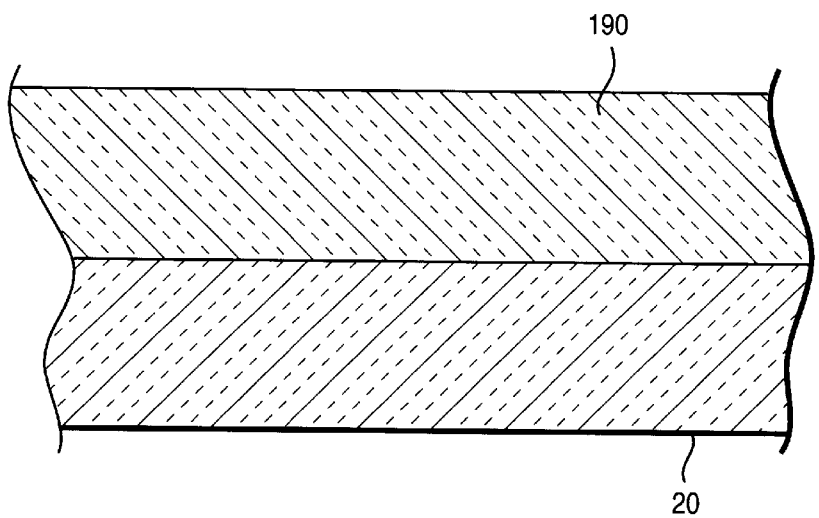
FIG. 14 is a cross-sectional view like FIG. 9, but depicts formation of an insulating layer on a substrate in an alternate exemplary process flow in accordance with the present invention.
Figure 15:
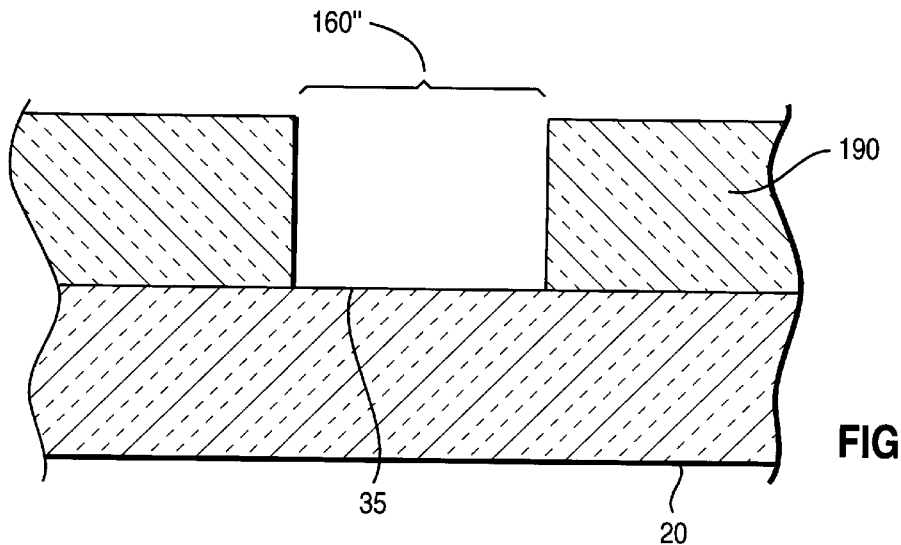
FIG. 15 is a cross-sectional view like FIG. 14 depicting formation of a via to the substrate in accordance with the present invention.

Another alternate exemplary process flow for fabricating a transistor in accordance with the present invention may be understood by referring now to FIGS. 14, 15, 16, 17 and 18, and initially to FIGS. 14 and 15. In this embodiment, an insulating layer 190 is formed on the substrate 20, masked, and anisotropically etched to yield a via 160" that extends to the upper surface 35 of the substrate 20. The insulating layer 190 may be composed of silicon dioxide, silicon nitride, or like materials. The etch may be accomplished by reactive ion etching, chemical plasma etching, or other suitable anisotropic etching techniques. The insulating layer 190 is designed to provide a sacrificial temporary structure to facilitate the later formation of a gate dielectric layer and a gate electrode as well as provide a energy absorbing barrier against the subsequent implantation of source/drain regions. Accordingly, the insulating layer 190 may have a thickness of about 800 to 2500 Å and advantageously about 1700 Å.

Figure 16:
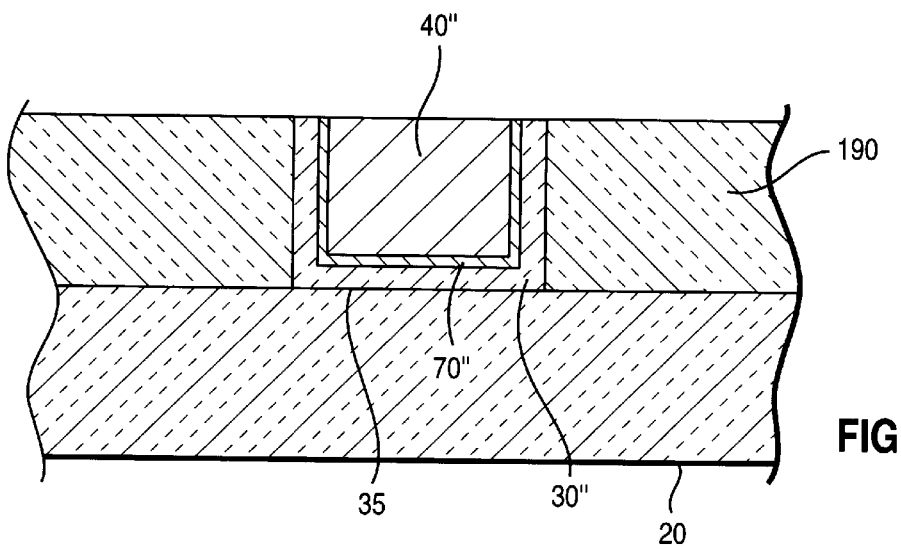
FIG. 16 is a cross-sectional view like FIG. 15 depicting formation of a gate dielectric layer and gate electrode in the via in accordance with the present invention.
Figure 17:
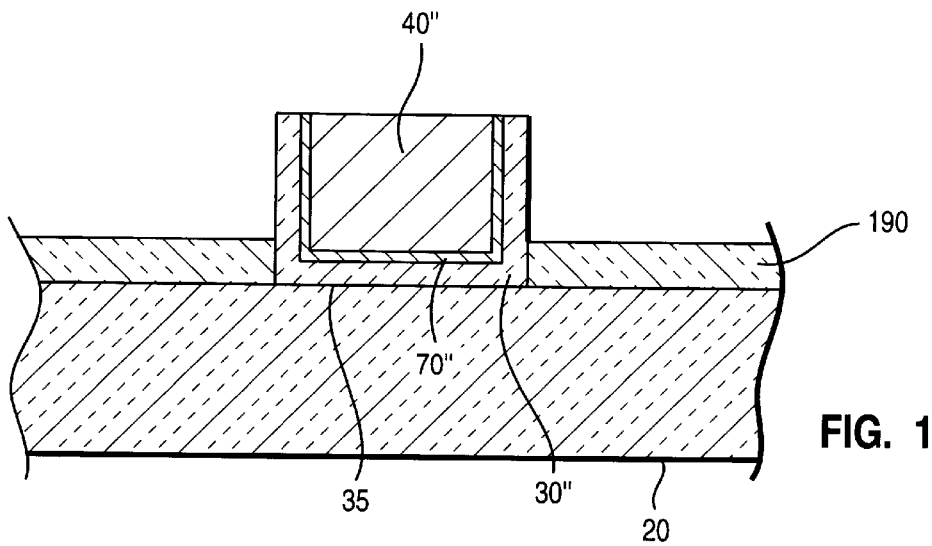
FIG. 17 is a cross-sectional view like FIG. 16 depicting removal of a portion of the semiconductor layer in accordance with the present invention.

Referring now to FIG. 16, the gate dielectric layer, the adhesion layer, and the gate electrode, now designated, respectively, 30", 70" and 40", may be formed in the via 160" as generally described above in relation to FIGS. 2–6. As with the embodiment depicted in FIGS. 9–13, the implant to establish source/drain regions may be performed at this stage provided that the energy is sufficient to penetrate the entirety of the insulating layer 190. However, the energy level may be reduced by first eliminating some of the insulating layer 190. In this regard, and as shown in FIG. 17, the thickness of the insulating layer 190 is reduced by etching. The etch process selected will depend upon the materials selected for the gate dielectric layer 30" and the insulating layer 190. For example, if silicon dioxide is selected for the gate dielectric layer 30" and Si$_3$N$_4$ is selected for the insulating layer 190, the insulating layer 190 may be etched using a hot $H_3PO_4$ dip process. Such an etch process will be selective to the $SiO_2$ so that the gate dielectric layer 30" will not be appreciably attacked during the etch. However, if the insulating layer 190 is composed of a material that requires an etch process that will also attack the gate dielectric layer 30", then the gate electrode 40" and the sidewalls 50 and 60 of the gate dielectric layer 30" should be masked against the etch process. Following the etch, the insulating layer 190 will have a thickness of about 50 to 200 Å and advantageously about 130 Å.

Figure 18:
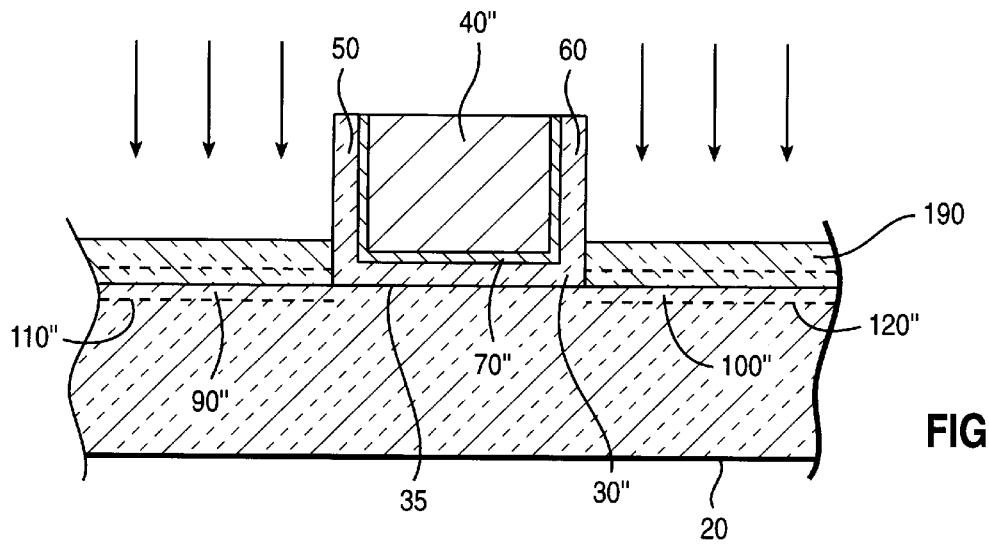
FIG. 18 is a cross-sectional view like FIG. 17 depicting formation of source/drain regions in accordance with the present invention.

Referring now to FIG. 18, source/drain regions, now designated 90" and 100", are established in the substrate 20 by ion implantation through the insulating layer 190. The insulating layer 190 slows the implanting dopant atoms, enabling the source/drain regions 90" and 100" to be established in the substrate 20 with very shallow junctions 110" and 120". Note that the source/drain regions 90" and 100" are depicted in FIG. 18 as being positioned partially in the substrate 20 and partially in the insulating layer 190. This depiction is merely to illustrate the fact that the implant will establish some dopant concentration in the insulating layer 190. However, the skilled artisan will appreciate that the dopant dispersed in the insulating layer 190 will not significantly alter the dielectric characteristics thereof, and that the actual vertical boundaries of the source/drain regions 90' and 100" will be positioned approximately at the junctions 110" and 120" and the interface between the upper surface 35 of the substrate 20 and the insulating layer 190. The energy and dosage for the implant to establish the source/drain regions 90" and 100" as well as the subsequent anneal may be as generally described in relation to the embodiment depicted in FIGS. 2–6.

Figure 19:
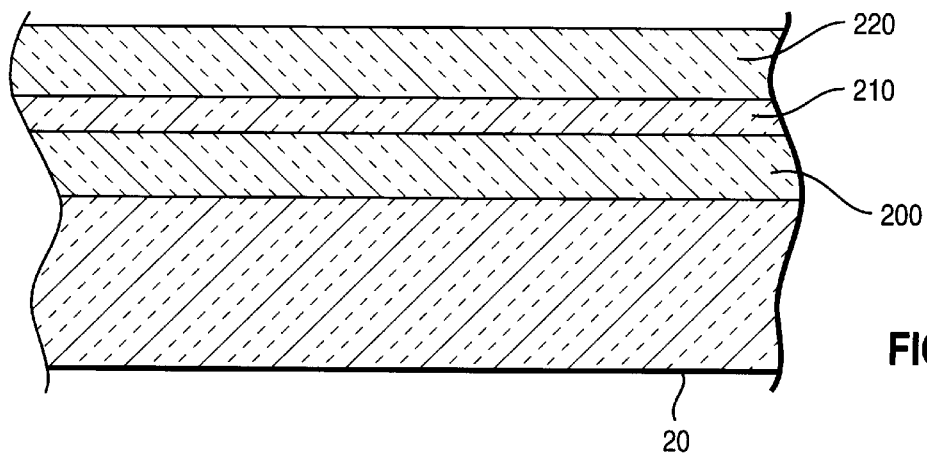
FIG. 19 is a cross-sectional view like FIG. 2 depicting formation of an insulating underlayer, an insulating intermediary layer and an insulating top layer in an alternate exemplary process flow in accordance with the present invention.
Figure 20:
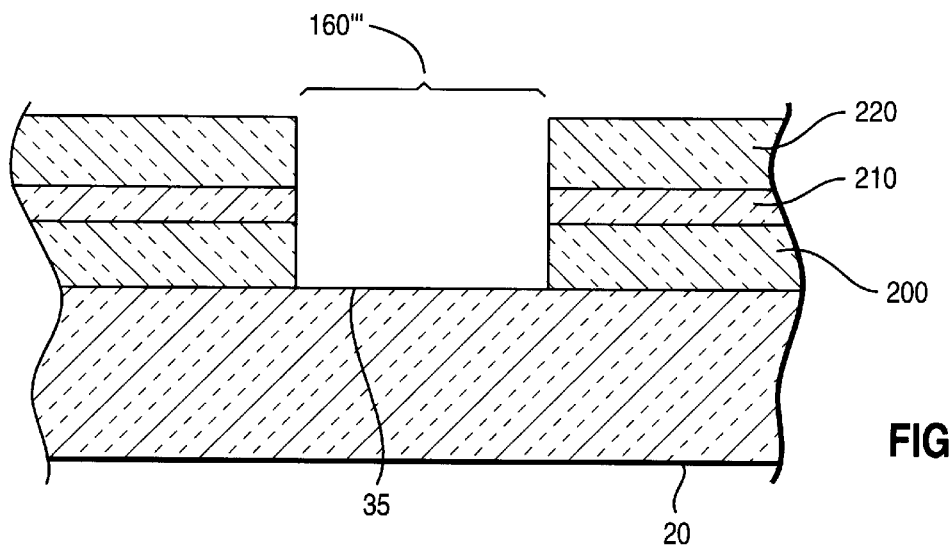
FIG. 20 is a cross-sectional view like FIG. 19 depicting formation of a via to the substrate in accordance with the present invention.

Another alternate exemplary process flow for fabricating a transistor in accordance with the present invention may be understood by referring now to FIGS. 19, 20, 21, 22 and 23, and initially to FIGS. 19 and 20. In this exemplary embodiment, insulating layers 200, 210 and 220 are stacked on the substrate 20, and the insulating layer 220 is masked and the layers 220, 210 and 200 are anisotropically etched to the upper surface 35 of the substrate 20 to yield a via 160'''. The insulating layers 200, 210 and 220 may be composed of a variety of dielectric materials, such as silicon dioxide, silicon nitride or the like. However, it is desirable for the layer 220 to be composed of a material that may be etched selectively to the layer 210, and for the layer 210 to be composed of a material that may be etched selectively to the insulating layer 200. In an exemplary embodiment, the layers 200 and 220 are composed of silicon dioxide and the layer 210 is composed of silicon nitride. The layer 200 may have a thickness of about 52 to 200 Å and advantageously about 130 Å. The layer 210 may have a thickness of about 20 to 100 Å and advantageously about 60 Å, and the layer 220 may have a thickness of about 750 to 2000 Å and advantageously about 1500 Å. The layers 200 and 220 may be formed by thermal oxidation, CVD or other suitable techniques for forming silicon dioxide. The layer 210, if composed of silicon nitride, may be formed by CVD. The etch of the via 160''' may be accomplished by reactive ion etching, chemical plasma etching, or like anisotropic etching techniques.

Figure 21:
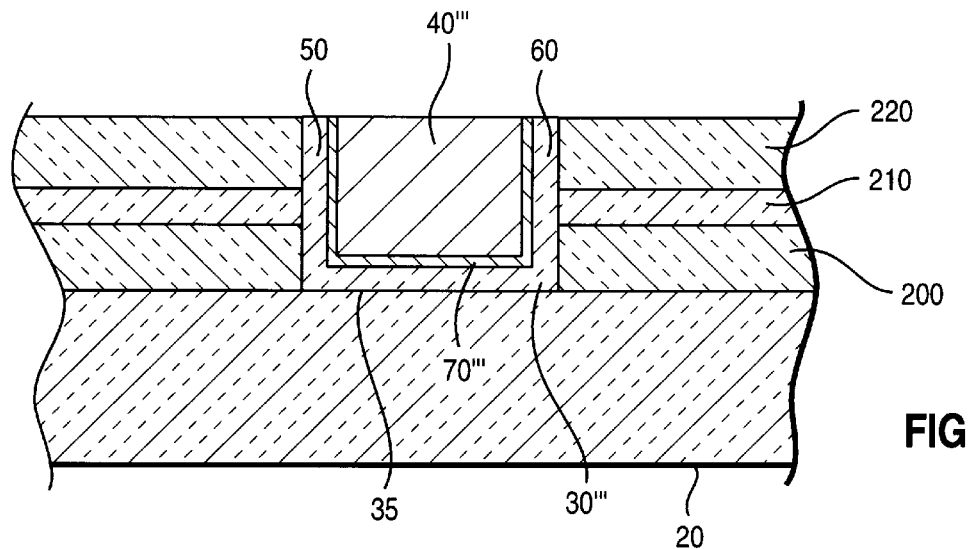
FIG. 21 is a cross-sectional view like FIG. 20 depicting formation of a gate dielectric layer and gate electrode in the via in accordance with the present invention.

Referring now to FIG. 21, the gate dielectric layer, the adhesion layer, and the gate electrode, now designated, respectively, 30''', 70''' and 40''', may be formed in the via 160''' as generally described above in relation to FIGS. 2–6. As with any of the foregoing illustrated embodiments, an implant to establish source/drain regions may be performed through the insulating layers 200, 210 and 220 provided that an adequate amount of energy is supplied to the dopant atoms. However, the implant energy may be reduced by removing the insulating layers 220 and 210, leaving only the insulating layer 200 in place prior to the implant.

Figure 22:
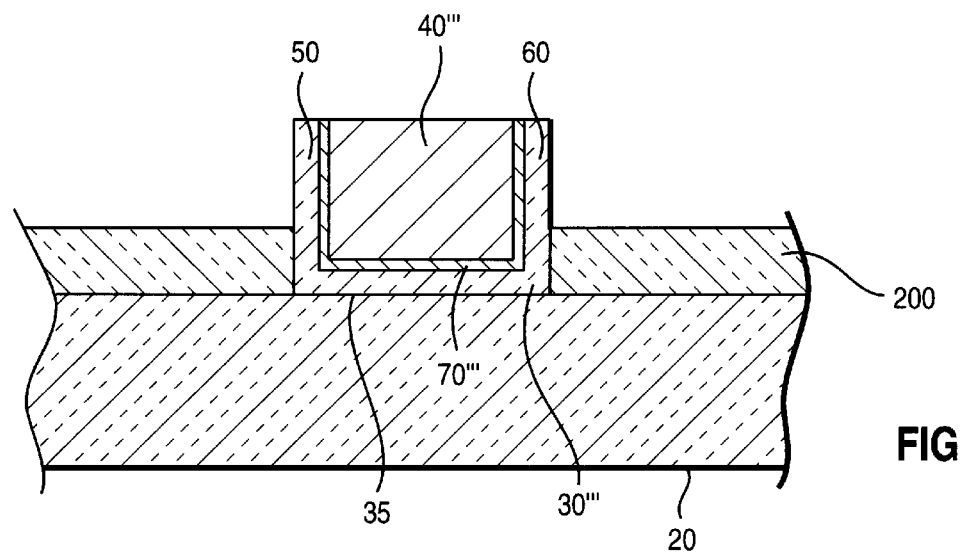
FIG. 22 is a cross-sectional view like FIG. 21 depicting removal of the top and intermediary layers in accordance with the present invention.

Referring now to FIGS. 21 and 22, the insulating layers 220 and 210 are removed by etching to leave the insulating layer 200 intact. As noted above, the insulating layer 220 is advantageously etchable selective to the insulating layer 210 and the insulating layer 210 is etchable selective to the insulating layer 200. The insulating layer 220 may be removed by reactive ion etching, chemical plasma etching or like anisotropic etching techniques. It is desirable that the etch process selected to remove both the layer 220 and the layer 210 but not significantly attack the spacers 50 and 60. The end point of the etch to remove the insulating layer 220 is assured by the presence of the insulating layer 210 which serves as an etch stop. Similarly, the end point of the etch to remove the insulating layer 210 is assured by the etch selectivity of the insulating layer 200. Where silicon nitride is selected for the insulating layer 210, the etch thereof may be by hot $H_3PO_4$ dip or other suitable etch processes to remove nitride.

Figure 23:
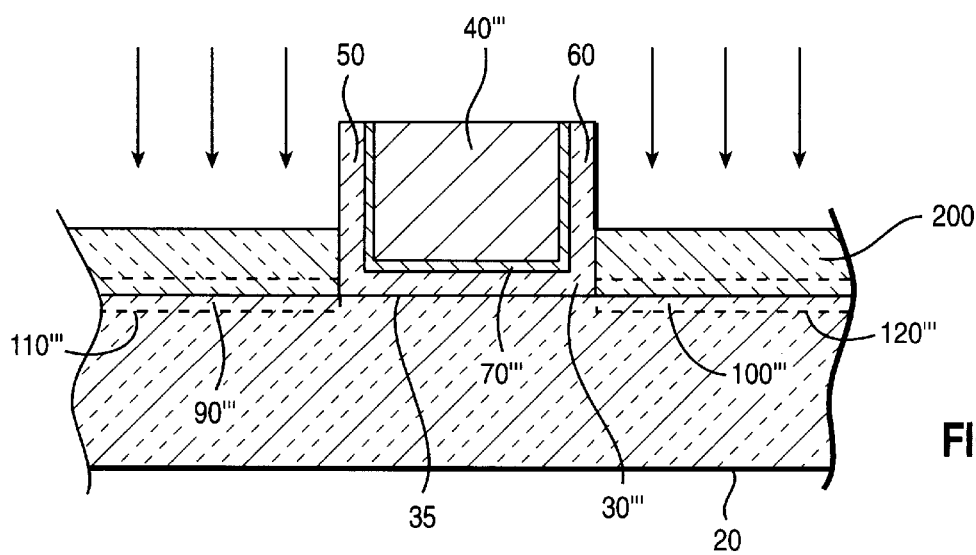
FIG. 23 is a cross-sectional view like FIG. 22 depicting formation of source/drain regions in accordance with the present invention.

Referring now to FIG. 23, source/drain regions, now designated 90''' and 100''' are established in the substrate 20 by ion implantation through the insulating layer 200. As with the embodiment depicted in FIGS. 14–18, the source/drain regions 90''' and 100''' will be established in the substrate 20 with very shallow junctions 110''' and 120''' due to the energy absorbing characteristics of the insulating layer 200. The depiction of the source/drain regions 90''' and 100''' being positioned simultaneously in the substrate 20 and the insulating layer 200 is merely to show the presence of some dopant atoms in the insulating layer 200 following the implant. However, as noted above, the actual vertical boundaries of the source/drain regions 90''' and 100''' will be positioned approximately at the junctions 110''' and 120''' and the interface between the upper surface 35 of the substrate 20 and the insulating layer 200. The energy and dosage for the implant to establish the source/drain regions 90''' and 100''' as well as the subsequent anneal may be as generally described in relation to the embodiment depicted in FIGS. 2–6.

Reference herein has been made to forming various openings in layers overlying the substrate 20, such as the semiconductor layer 80 (See FIG. 3) or the insulating layer 200 (See FIG. 20), by masking and etching those layers 80 and 200 and any other layers which are positioned thereon. However, it should be understood that an opening may be established in a layer, such as the layer 80 in FIG. 1, by first establishing a structure on the substrate 20 by appropriate masking and etching, such as the combined gate electrode 40, adhesion layer 70 and insulating layer 30, and subsequently forming the layer 80 on either side of the structure. In either case, the structure and the layer 80 are integrated.

The process in accordance with the present invention yields a transistor with elevated source/drain regions and correspondingly shallow junctions. Dielectric sidewall spacer formation is integrated with gate dielectric and gate electrode fabrication. The number of required masking steps is reduced. Thermal budget is conserved as the number of required high temperature steps is both reduced and moved forward in the process flow.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a transistor on a substrate, comprising the steps of:

forming a semiconductor layer on the substrate;

forming an intermediary layer on the semiconductor layer and a top layer on the intermediary layer, the top layer being etch selective to the intermediary layer and the intermediary layer being etch selective to the semiconductor layer;

forming a via in the intermediary layer, the top layer and the semiconductor layer extending to the substrate;

forming an insulting layer in the via, the insulating layer having first and second sidewall spacers;

forming a gate electrode on the insulating layer;

removing the top and intermediary layers following the step forming the gate electrode layer; and forming first and second source/drain regions, wherein each of the first and second source/drain regions has a first portion positioned in the semiconductor layer and a second portion positioned in the substrate.

2. The method of claim 1, wherein the step of forming the semiconductor layer comprises depositing polysilicon on the substrates.

3. The method of claim 2, wherein the step of forming the insulating layer comprises oxidizing the surfaces of the semiconductor layer and the substrate exposed by the via to form silicon dioxide.

4. The method of claim 2, wherein the step of forming the insulating layer comprises depositing silicon dioxide on the surfaces of the semiconductor layer and the substrate exposed by the via.

5. The method of claim 1, wherein the step of forming the intermediary layer comprises oxidizing a portion of the semiconductor layer to form silicon dioxide.

6. The method of claim 5, wherein the step of forming the top layer comprises depositing polysilicon on the intermediary layer.

7. The method of claim 1, wherein the step of forming the gate electrode comprises forming an adhesion layer on the insulating layer and a conductor layer on the adhesion layer.

8. The method of claim 7, wherein the step of forming the adhesion layer comprises forming a layer of titanium nitride on the insulating layer and the step of forming the conductor layer comprises depositing tungsten on the titanium nitride.

9. The method of claim 1, comprising reducing the thickness of the semiconductor layer by etching after the step of forming the insulating layer.

10. The method of claim 1, wherein the step of forming the first and second source/drain regions comprises implanting the semiconductor layer and the substrate with a dopant specie.

* * * * *

UNITED STATES PATENT AND TRADEMARK OFFICE
CERTIFICATE OF CORRECTION

PATENT NO. : 6,211,025 B1
DATED : April 3, 2001
INVENTOR(S) : Mark I. Gardner et al.

It is certified that error appears in the above-identified patent and that said Letters Patent is hereby corrected as shown below:

<u>Claims,</u>
<u>Claim 1,</u>
Line 22, insert the word -- of -- between the words "step" and "forming", and delete the word "layer" after the word "electrode"; and <u>Claim 2,</u> Delete the word "substrates" and substitute the word -- substrate -- therefor.

Signed and Sealed this

Sixth Day of November, 2001

Attest:

*Nicholas P. Godici*

NICHOLAS P. GODICI
*Attesting Officer*     *Acting Director of the United States Patent and Trademark Office*